United States Patent
Liu et al.

(10) Patent No.: US 9,219,151 B1
(45) Date of Patent: Dec. 22, 2015

(54) METHOD FOR MANUFACTURING SILICON NITRIDE LAYER AND METHOD FOR MANUFACTURING SEMICONDUCTOR STRUCTURE APPLYING THE SAME

(71) Applicant: UNITED MICROELECTRONICS CORP., Hsinchu (TW)

(72) Inventors: Wei-Hsin Liu, Changhua County (TW); Tzu-Chin Wu, Chiayi County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/477,214

(22) Filed: Sep. 4, 2014

(51) Int. Cl.
*H01L 21/31* (2006.01)
*H01L 29/78* (2006.01)
*H01L 21/02* (2006.01)

(52) U.S. Cl.
CPC ........ *H01L 29/7843* (2013.01); *H01L 21/0217* (2013.01); *H01L 21/0234* (2013.01); *H01L 21/02164* (2013.01); *H01L 21/02274* (2013.01)

(58) Field of Classification Search
CPC ............... H01L 29/7843; H01L 21/823864; H01L 21/324; H01L 21/823412; H01L 21/02164; H01L 21/76828; H01L 21/76834; H01L 21/76832; H01L 29/6653; H01L 21/823807
USPC .................. 438/275, 300, 301, 303, 585, 791
See application file for complete search history.

(56) References Cited

U.S. PATENT DOCUMENTS

| | | | |
|---|---|---|---|
| 7,265,009 B2 | 9/2007 | Chen | |
| 7,381,451 B1 * | 6/2008 | Lang et al. | 427/569 |
| 7,465,680 B2 * | 12/2008 | Chen et al. | 438/788 |
| 7,645,697 B2 | 1/2010 | Lee | |
| 2008/0087965 A1 * | 4/2008 | Chen et al. | 257/368 |

* cited by examiner

*Primary Examiner* — Evan Pert
*Assistant Examiner* — Changhyun Yi
(74) *Attorney, Agent, or Firm* — WPAT, PC; Justin King

(57) ABSTRACT

A method for manufacturing a silicon nitride layer and a method for manufacturing a semiconductor structure applying the same are provided. The method for manufacturing a silicon nitride layer includes forming the silicon nitride layer and stressing the silicon nitride layer by a high density plasma chemical vapor deposition (HDPCVD) treatment.

9 Claims, 3 Drawing Sheets

METHOD FOR MANUFACTURING SILICON NITRIDE LAYER AND METHOD FOR MANUFACTURING SEMICONDUCTOR STRUCTURE APPLYING THE SAME

BACKGROUND

1. Technical Field

The disclosure relates to a method for manufacturing a semiconductor structure. More particularly, the disclosure relates to a method for manufacturing a silicon nitride layer and a method for manufacturing a semiconductor structure applying the same.

2. Description of the Related Art

In the field of metal oxide semiconductor (MOS) devices, researchers and engineers have been made effort to increase the carrier mobility so as to improve the device performance. For a p-type metal oxide semiconductor (PMOS) device, dopant implantation may be adopted. While for a n-type metal oxide semiconductor (NMOS) device, one approach is to create a contact etch stop layer (CESL) over the NMOS device to provide a tensile stress. The carrier mobility in the NMOS device may be further increased by stressing the contact etch stop layer. This may be achieved by thermal curing, UV curing, electron beam curing, or the like.

SUMMARY

In this disclosure, a method for manufacturing a silicon nitride layer using a new approach for stressing and a method for manufacturing a semiconductor structure applying the same are provided.

According to some embodiment, the method for manufacturing a silicon nitride layer comprises following steps. First, the silicon nitride layer is formed. Then, the silicon nitride layer is stressed by a high density plasma chemical vapor deposition (HDPCVD) treatment.

According to some embodiment, the method for manufacturing a semiconductor structure comprises following steps. First, a substrate is provided. A NMOS is formed on the substrate. A contact etch stop layer is formed over the NMOS. Then, the contact etch stop layer is stressed by a HDPCVD treatment.

Figure 1A:
FIG. 1A-FIG. 1E schematically show a method for manufacturing a semiconductor structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

According to one embodiment, a method for manufacturing a silicon nitride ($SiN_x$) layer using a new approach for stressing is provided. The method comprises forming the silicon nitride layer and stressing the silicon nitride layer by a HDPCVD treatment. A thickness of the silicon nitride layer may be ranged from 200 Å to 300 Å. The silicon nitride layer may be formed by plasma-enhanced chemical vapor deposition (PECVD). According to some examples, the stressing of the silicon nitride layer by the HDPCVD treatment is carried out right after the forming of the silicon nitride layer. The stressing of the silicon nitride layer by the HDPCVD treatment may be carried out at a temperature lower than 450° C. for such as 5 s to 120 s, preferably 5 s to 30 s. In some example, the power for the HDPCVD treatment may be lower than 8000 W. In some example, a $H_2$ gas, an $O_2$ gas, an Ar gas, a He gas or a $N_2$ gas may be optionally provided during the HDPCVD treatment. The flow rate of the gas may be lower than 1000 sccm.

After stressing the silicon nitride layer by the HDPCVD treatment, the silicon nitride layer is tensile stressed. According to some examples, a tensile stress of the silicon nitride layer is increased 10% to 20% by the stressing of the silicon nitride layer by the HDPCVD treatment. According to some examples, a tensile stress of the silicon nitride layer is increased 10% to 60% by the stressing of the silicon nitride layer by the HDPCVD treatment.

According to some embodiment, a method for manufacturing a semiconductor structure applying the method for manufacturing a silicon nitride layer which, for example, have been described above is provided, as shown in FIG. 1A-FIG. 1E.

Referring to FIG. 1A, a substrate 102 is provided. The substrate 102 may be formed of silicon (Si), silicon on insulator (SOI), stacked SOI (SSOI), SiGe on insulator (SiGeOI), stacked SiGeOI (SSiGeOI), or the like.

Figure 1B:
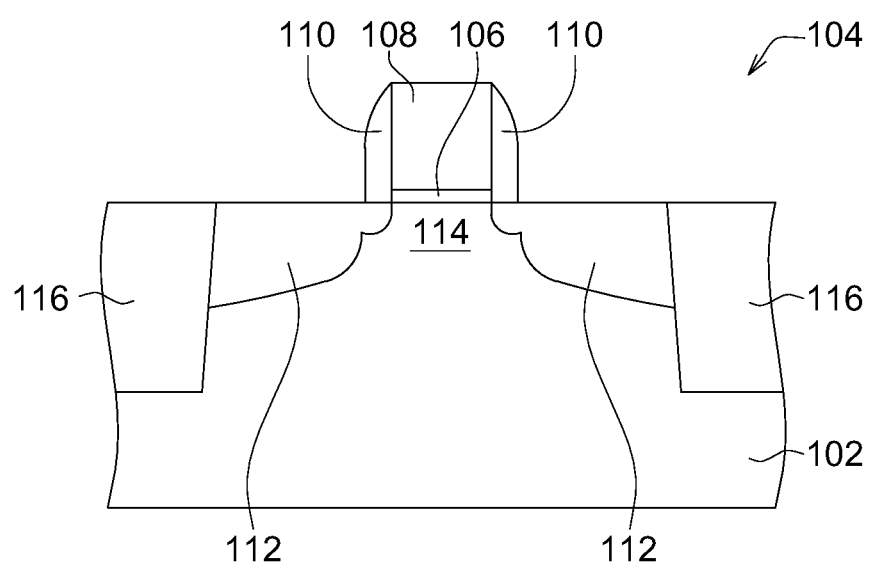
Figure 1C:
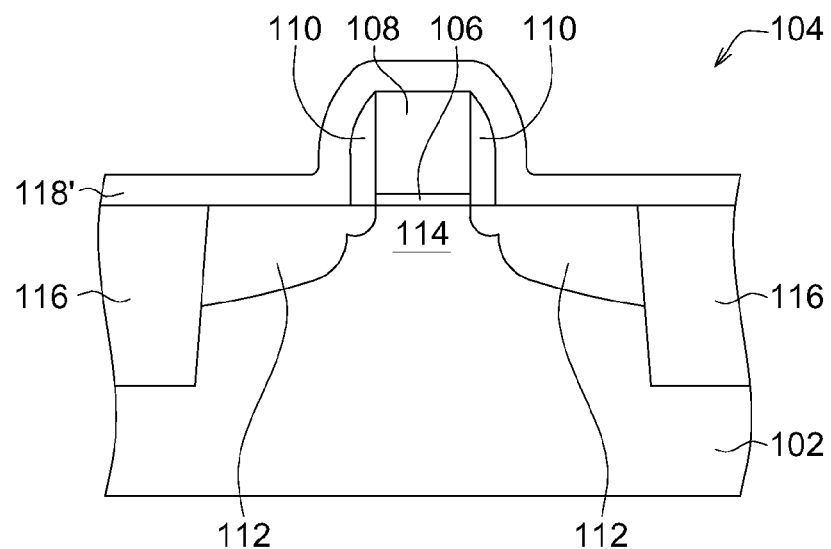

Referring to FIG. 1B, a NMOS 104 is formed on the substrate 102. A gate dielectric 106 and a gate 108 are formed sequentially on the substrate 102. The gate dielectric 106 may be formed of silicon oxide ($SiO_y$) or other suitable high-k dielectric materials. The gate 108 may be formed of polysilicon, metal, or the like. Sidewall spacers 110 are formed on both sides of the gate 108. Source/drain regions 112 are formed in the substrate 102, and a channel region 114 is formed therebetween. Further, isolation structures 116, such as shallow trench isolations, may be formed outside the source/drain regions 112.

Referring to FIG. 1O, a contact etch stop layer 118' is formed over the NMOS 104. The contact etch stop layer 118' may be formed of silicon nitride by PECVD. A thickness of the contact etch stop layer 118' may be ranged from 200 Å to 300 Å.

Figure 1D:
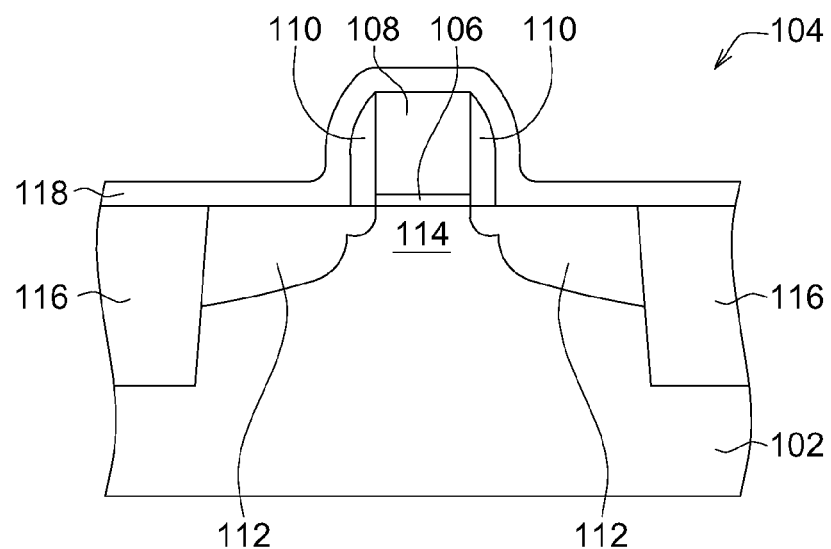

Referring to FIG. 1D, the contact etch stop layer 118' is stressed by a HDPCVD treatment. After the HDPCVD treatment, the contact etch stop layer 118 shrinks and is tensile stressed. The stressing of the contact etch stop layer 118' by the HDPCVD treatment may be carried out right after the forming of the contact etch stop layer 118'. The stressing of the contact etch stop layer 118' by the HDPCVD treatment may be carried out at a temperature lower than 450° C. for such as 5 s to 120 s, preferably 5 s to 30 s. In some example, the power for the HDPCVD treatment may be lower than 8000 W. In some example, a $H_2$ gas, an $O_2$ gas, an Ar gas, a He gas or a $N_2$ gas may be optionally provided during the HDPCVD treatment. The flow rate of the gas may be lower than 1000 sccm. According to some examples, a tensile stress of the contact etch stop layer 118 is increased 10% to 20% by the stressing of the contact etch stop layer 118' by the HDPCVD treatment. According to some examples, a tensile stress of the contact etch stop layer 118 is increased 10% to 60% by the stressing of the contact etch stop layer 118' by the HDPCVD treatment.

Figure 1E:
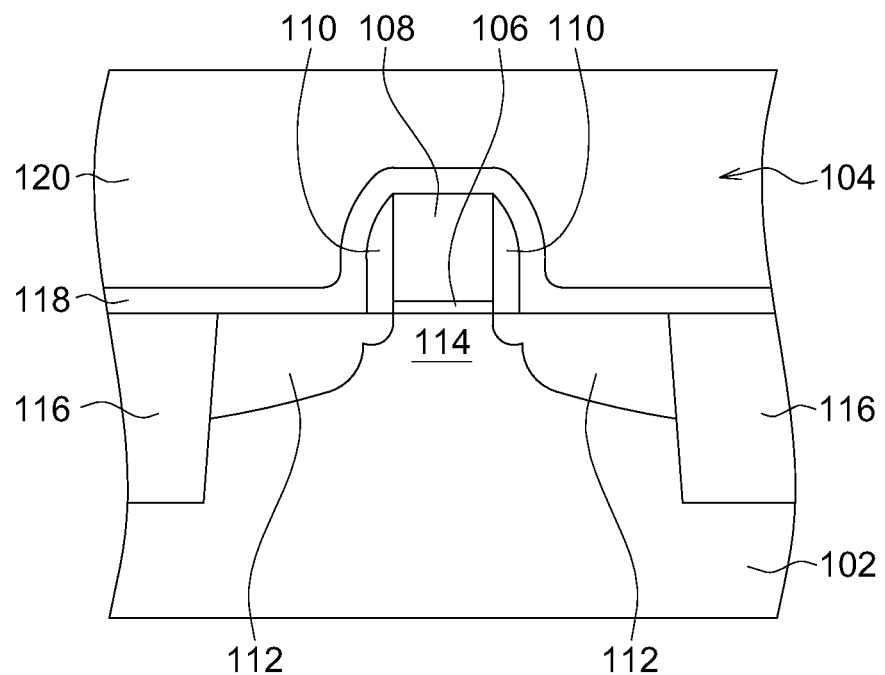

Referring to FIG. 1E, after stressing the contact etch stop layer 118' by the HDPCVD treatment, an inter layer dielectric 120 may be formed by the HDPCVD treatment. The inter layer dielectric may be formed of $SiO_2$, doped-$SiO_2$, undoped silicate glass (USG), phosphosilicate glass (PSG), or the like. In some examples, the stressing of the contact etch stop layer 118' and the forming of the inter layer dielectric 120 may be carried out sequentially in a same chamber. In some alternative examples, the stressing of the contact etch stop layer 118' and the forming of the inter layer dielectric 120 are carried out in different chambers of a same apparatus without breaking into air. Thereafter, other process, such as the forming of source/drain contacts, may be carried out.

In this embodiment, the stressing of the contact etch stop layer 118' takes for less than 2 minutes, and is carried out by the HDPCVD treatment, which may be used to form the inter layer dielectric 120 at the next step. As such, the stressing process according to this embodiment is more time-saving compared to a traditional UV curing process, which typically takes for more than 7 minutes and needs a change of the apparatus.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for manufacturing a semiconductor structure, comprising:
   providing a substrate;
   forming a n-type metal oxide semiconductor (NMOS) on the substrate;
   forming a contact etch stop layer over the NMOS;
   stressing the contact etch stop layer by a high density plasma chemical vapor deposition (HDPCVD) treatment; and
   forming an inter layer dielectric by the HDPCVD treatment;
   wherein the stressing of the contact etch stop layer and the forming of the inter layer dielectric are carried out sequentially in a same chamber or carried out in different chambers of a same apparatus without breaking into air.

2. The method according to claim 1, wherein the stressing of the contact etch stop layer by the HDPCVD treatment is carried out right after the forming of the contact etch stop layer.

3. The method according to claim 1, wherein the contact etch stop layer is formed of silicon nitride.

4. The method according to claim 1, wherein a thickness of the contact etch stop layer is ranged from 200 Å to 300 Å.

5. The method according to claim 1, wherein the stressing of the contact etch stop layer by the HDPCVD treatment is carried out at a temperature lower than 450° C. for 5 s to 120 s.

6. The method according to claim 1, wherein the inter layer dielectric is formed of $SiO_2$, doped-$SiO_2$, undoped silicate glass (USG) or phosphosilicate glass (PSG).

7. The method according to claim 1, wherein after stressing the contact etch stop layer by the HDPCVD treatment, the contact etch stop layer is tensile stressed.

8. The method according to claim 1, wherein a tensile stress of the contact etch stop layer is increased 10% to 60% by the stressing of the contact etch stop layer by the HDPCVD treatment.

9. The method according to claim 1, wherein a tensile stress of the contact etch stop layer is increased 10% to 20% by the stressing of the contact etch stop layer by the HDPCVD treatment.

\* \* \* \* \*